United States Patent [19]
Yoshioka

[11] Patent Number: 5,212,576
[45] Date of Patent: May 18, 1993

[54] INSULATING MATERIAL WITH COEFFICIENT LINEAR EXPANSION MATCHING THAT OF ONE SUBSTRATE OVER CONNECTION BETWEEN TWO CONDUCTIVE PATTERNS

[75] Inventor: Kazuo Yoshioka, Nagasaki, Japan

[73] Assignee: Mitsubishi Denki Kabushiki Kaisha, Tokyo, Japan

[21] Appl. No.: 808,226

[22] Filed: Dec. 16, 1991

[30] Foreign Application Priority Data

Dec. 18, 1990 [JP] Japan .................................. 2-411296

[51] Int. Cl.$^5$ .................................................. G02F 1/13
[52] U.S. Cl. ........................................ 359/88; 359/79; 359/87
[58] Field of Search ............................. 359/88, 87, 79

[56] References Cited

U.S. PATENT DOCUMENTS

| | | | |
|---|---|---|---|
| 4,640,581 | 2/1987 | Nakanowatari et al. | 359/88 |
| 4,643,526 | 2/1987 | Watanabe et al. | 359/88 |
| 4,855,872 | 8/1989 | Wojnar et al. | 361/414 |
| 4,896,946 | 1/1990 | Suzuki et al. | 359/88 |
| 5,042,919 | 8/1991 | Yabu et al. | 359/88 |
| 5,067,796 | 11/1991 | Suzuki et al. | 359/88 |

FOREIGN PATENT DOCUMENTS

| | | | |
|---|---|---|---|
| 0000932 | 1/1989 | Japan | 359/88 |
| 1-253791 | 10/1989 | Japan . | |
| 2-22694 | 1/1990 | Japan . | |
| 2-46426 | 2/1990 | Japan . | |
| 2-33032 | 3/1990 | Japan . | |
| 2-74922 | 3/1990 | Japan . | |
| 2-51322 | 4/1990 | Japan . | |
| 2-119150 | 5/1990 | Japan . | |

*Primary Examiner*—John Zazworsky
*Assistant Examiner*—Anita Pellman Gross
*Attorney, Agent, or Firm*—Burns, Doane, Swecker & Mathis

[57] ABSTRACT

An electric circuit wherein an insulating material having a coefficient of linear expansion approximately equal to that of glass is bonded to a part where an electrode pattern formed on a glass substrate is connected to a conductive pattern formed on a substrate made of an insulating material such as polyimide or the like, thereby restricting the thermal stress to be small at the connecting part between the conductive pattern and electrode pattern.

9 Claims, 8 Drawing Sheets

INSULATING MATERIAL WITH COEFFICIENT LINEAR EXPANSION MATCHING THAT OF ONE SUBSTRATE OVER CONNECTION BETWEEN TWO CONDUCTIVE PATTERNS

BACKGROUND OF THE INVENTION

1. Field of the Invention

This invention relates to an electric circuit for use in a liquid crystal display apparatus and the like, in which an electrode pattern arranged on a glass substrate is connected to a conductive pattern on a flexible insulating film.

2. Description of Related Art

FIG. 1 is a perspective view of a conventional liquid crystal display apparatus using a flexible printed circuit (FPC) disclosed, for example, in the Japanese Patent Application Laid-Open No. 1-253791 (253791/1989). A liquid crystal panel 1 is constituted of two glass substrates 2 facing each other and a liquid crystal sealed between the glass substrates 2. The glass substrates 2 are provided in a manner that the electrode patterns arranged in stripes thereon intersect each other.

On the three sides of the liquid crystal display panel 1, plural FPC substrates 21 of insulating films with IC chips thereon for supplying signals to the electrodes are provided. On the rest one side of the liquid crystal display panel 1, an FPC substrate 22 of an insulating film for connecting the gate bus lines formed on the upper and lower halves of the liquid crystal display panel 1.

FIG. 2 is a plane view of a conventional insulating film with a conductive pattern formed thereon by the tape automated bonding (TAB) disclosed in the Japanese Patent Application Laid-Open No. 2-74922 (74922/1990), for instance. One ends of input terminals 25 and output terminals 26 formed on a base film 23 are connected to an IC chip 24, with the other ends thereof being connected to an electrode pattern formed on a glass substrate (not shown). In this case, the output terminals 26 are connected to the electrode pattern on the glass substrate by means of an anisotropic conductive film as depicted, e.g., in the Japanese Patent Application Laid-Open Nos. 2-22694 (22694/1990), 2-46426 (46426/1990) and the Japanese Utility Model Application Laid-Open No. 2-33032 (33032/1990).

FIG. 3 is a plane view of another insulating film having a conductive pattern formed thereon through TAB, disclosed, e.g., in the Japanese Utility Model Application Laid-Open No. 2-51322 (51322/1990). Similar to the above example of FIG. 2, one ends of input terminals 25 and output terminals 26 formed on a base film 23 are connected to an IC chip 24, and the other ends thereof are connected to an electrode pattern on a glass substrate (not shown). The output terminals 26 and electrode pattern on the glass substrate are connected with each other through soldering as described, for example, in the Japanese Utility Model Application Laid-Open No. 2-119150 (119150/1990).

The operation of the conventional electric circuit as aforesaid will be explained hereinafter.

In the liquid crystal display apparatus of FIG. 1, the displaying data generated by the IC chip 24 on the FPC substrate 21 is fed to source bus lines, so that the impressed voltage to the liquid crystals changed the transmittance or color of the liquid crystal panel 1, thereby obtaining the aimed images.

Meanwhile, as indicated in FIG. 2, the IC chip 24 on the base film 23 is connected to the input and output terminals 25 and 26 via electrodes, and the IC chip 24 outputs an image signal to the output terminal 26 on the basis of an input signal from the input terminal 25.

Also in FIG. 3, the IC chip 24 mounted on the base film 23 generates the data inputted to the input terminal 25 to the terminal 26 as an image signal for each pixel.

In the aforementioned structure of the electric circuit employed hitherto in the liquid crystal display apparatus, in the case where the FPC substrates 21, 22 and base film 23 are polyimide, although the nominal coefficient of linear expansion of polyimide is $20 \times 10^{-6}$ and larger than that of glass, $9 \times 10^{-6}$, the difference of the coefficients of linear expansion does not matter when the output terminal of the FPC substrate or TAB film, namely, a connected part to the electrode pattern on the glass substrate 2 is relatively short. However, when an increase in the number of output signals from each IC chip 24 or a plurality of IC chips 24 mounted to a single FPC substrate or TAB film (multi-chip TAB) elongates the part connected to the electrode pattern on the glass substrate 2, it becomes a problem.

In other words, when the connected part is exposed to the heat cycle generated by the power of the apparatus being turned ON or OFF, the bond strength at the connected part reduces due to the thermal stress resulting from the difference of the coefficients of linear expansion, thereby increasing the resistance against connection, or in extreme case, leading to a disconnection.

SUMMARY OF THE INVENTION

Accordingly, this invention has been devised to solve the above-mentioned disadvantages and has for its main object to provide an electric circuit wherein an insulating material having approximately the equal coefficient of linear expansion as glass is bonded to a connecting part between a conductive pattern and an electrode pattern, so that the thermal stress brought about at the connecting part in the heating cycle by a power source being turned ON/OFF is restricted, thereby preventing an increase of the resistance against connection in the connected part or a disconnection due to the deterioration of the bond strength.

The above and further objects and features of the invention will more fully be apparent from the following detailed description with accompanying drawings.

DESCRIPTION OF THE PREFERRED EMBODIMENTS

A preferred embodiment of this invention will be discussed hereinafter with reference to the accompanying drawings.

Figure 1:
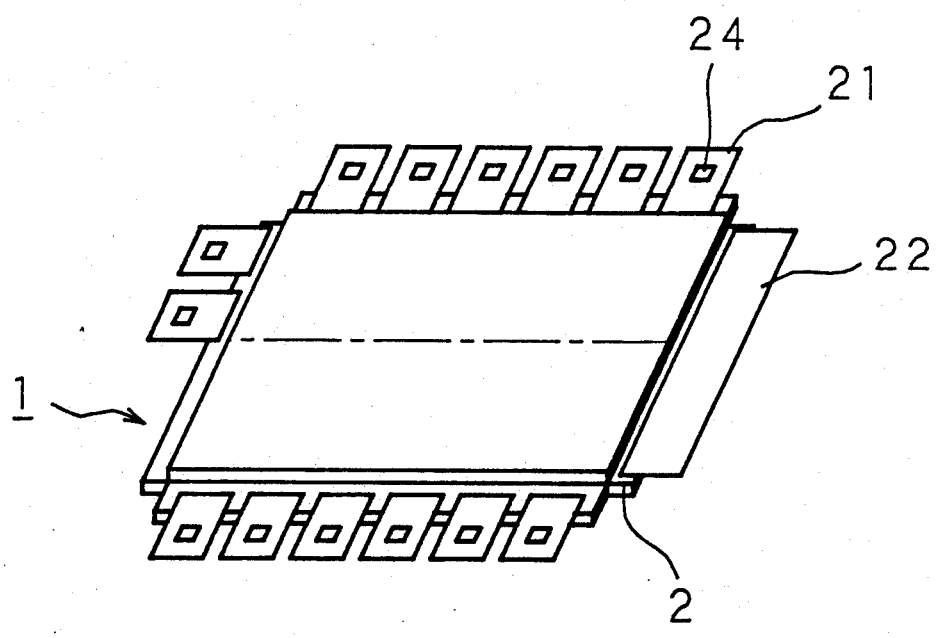
FIG. 1 is a perspective view of a liquid crystal display apparatus employing a conventional electrical circuit.
Figure 2:
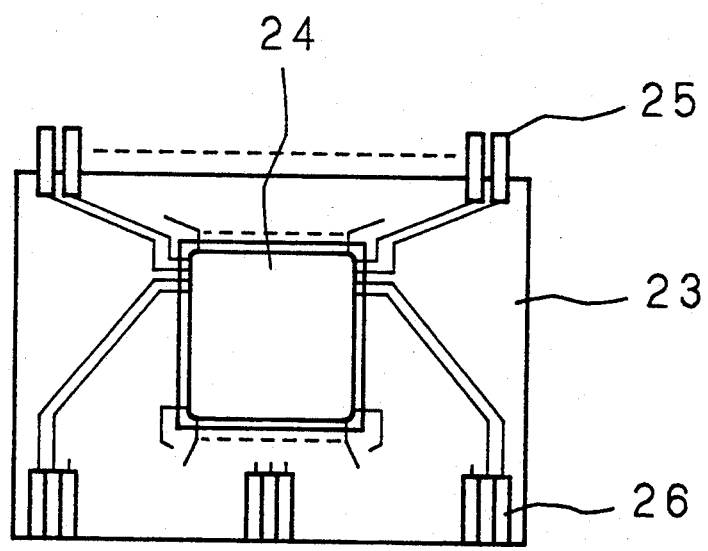
FIG. 2 is a plane view of a conventional insulating film having a conductive pattern formed thereon.
Figure 3:
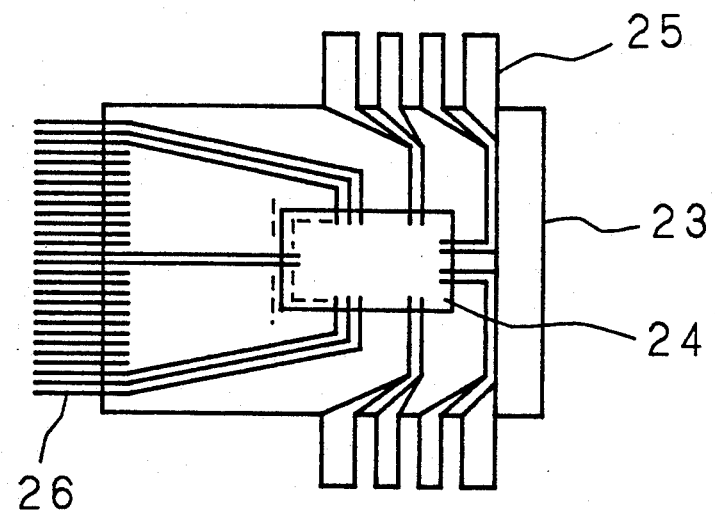
FIG. 3 is a plane view of another conventional insulating film having a conductive pattern formed thereon.
Figure 4:
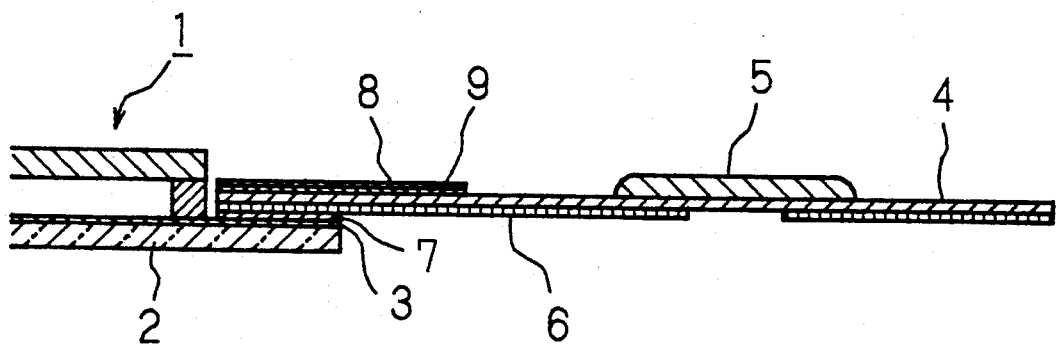
FIG. 4 is a cross sectional view of a connecting part of an electric circuit according to this invention.

In a liquid crystal display panel 1 shown in FIG. 4, an electrode pattern 3 is arranged in stripes on a glass substrate 2. An end of the electrode pattern 3 is electrically connected via an anisotropic conductive film 7 to an end of a conductive pattern formed on a base film 4 of an insulating film.

A ceramic plate 8, as an insulating material having approximately the equal coefficient of linear expansion to glass, is bonded by an adhesive 9 to the part of the base film 4 where the conductive pattern 6 and electrode pattern 3 are connected to each other. The other end of the conductive pattern 6 is connected to an IC chip 5 mounted on the base film 4.

As described earlier with reference to the conventional examples, polyimide is generally used as the insulating film of an FPC substrate or a TAB where a conductive pattern is formed. The coefficient of linear expansion of polyimide is nominally $20 \times 10^{-6}$, but greatly varies due to the manufacturing lots. In some cases, $40 \times 10^{-6}$ is measured.

When the ceramic plate 8 having the coefficient of linear expansion of $5.3 \times 10^{-6}$ is bonded by the thermosetting adhesive 9 while the polyimide having the above-mentioned property is used as the base film 4, the coefficient of linear expansion of the bonded part becomes $7.5 \times 10^{-6}$, which is almost equal to $9 \times 10^{-6}$ of the coefficient of linear expansion of the glass substrate 2. Since the difference of the coefficients of linear expansion between the base film 4 and glass substrate 2 is very small, the thermal stress brought about at the connecting part between the conductive pattern 6 on the FPC or TAB and the electrode pattern 3 on the glass substrate 2 decreases to a large extent.

Figure 5:
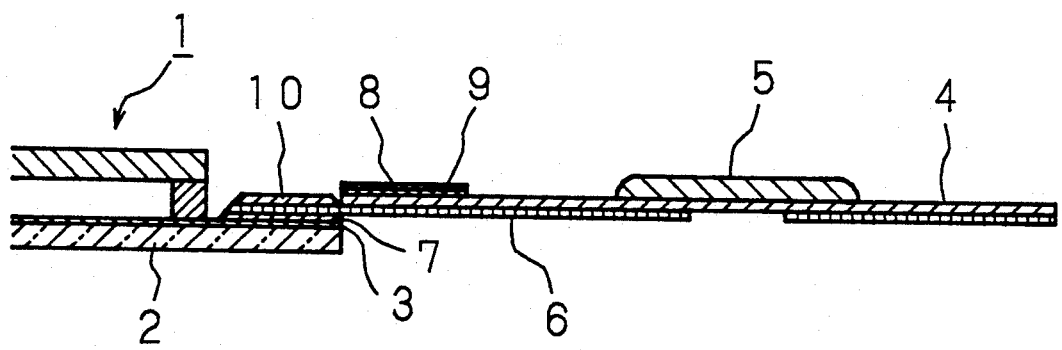
FIG. 5 is a cross sectional view of a connecting part of an electric circuit according to a different embodiment of this invention.

FIG. 5 is a cross sectional view of a connecting part of the electric circuit according to a different embodiment. In the embodiment of FIG. 5, the conductive pattern 6 on the base film 4 is connected to the electrode pattern 3 of the glass substrate 2 by a solder 10. In FIG. 5, the same reference numerals as in FIG. 4 designate the same parts.

In the modified embodiment of FIG. 5 alike, since the ceramic plate 8 is integrally bonded to an end of the base film 4 by the adhesive 9, the difference of the coefficients of linear expansion at the connecting part between the glass substrate 2 and base film 4 is restricted to be small. Consequently, the electrode pattern 3 is prevented from being peeled from the conductive pattern 6. Moreover, an increase of the resistance against connection or a disconnection between the patterns 3 and 6 via the solder 10 can be surely avoided.

Figure 6:
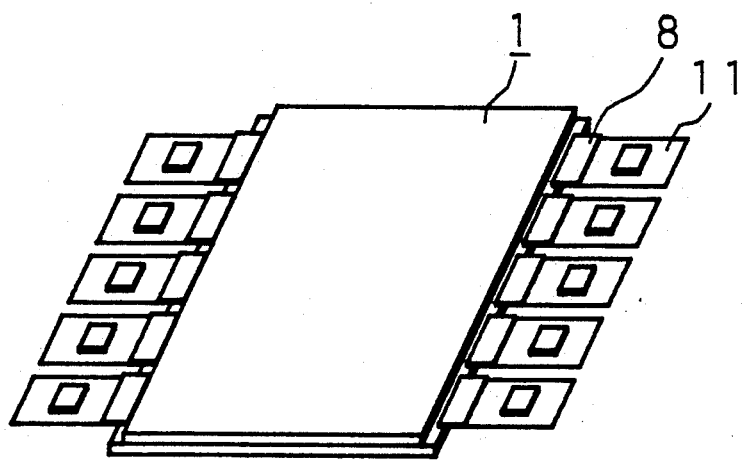
FIG. 6 is a perspective view of a liquid crystal display apparatus employing the electric circuit of this invention.

FIG. 6 is a perspective view of a liquid crystal display apparatus using the electric circuit of FIG. 4 or 5. The ceramic plate 8 is provided for every insulating film 11 of TAB having the conductive pattern thereon.

Figure 7:
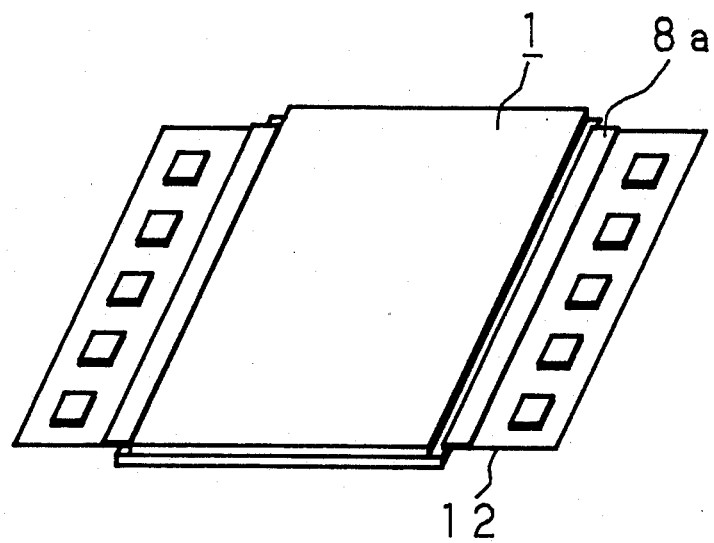
FIG. 7 is a perspective view of a modified liquid crystal display device employing the electric circuit of this invention.

FIG. 7 is a perspective view of a modification of a liquid crystal display apparatus using the electric circuit of FIG. 4 or 5. A long ceramic plate 8a is bonded onto an FPC insulating film 12 onto which a plurality of IC chips 5 are mounted.

Figure 8:
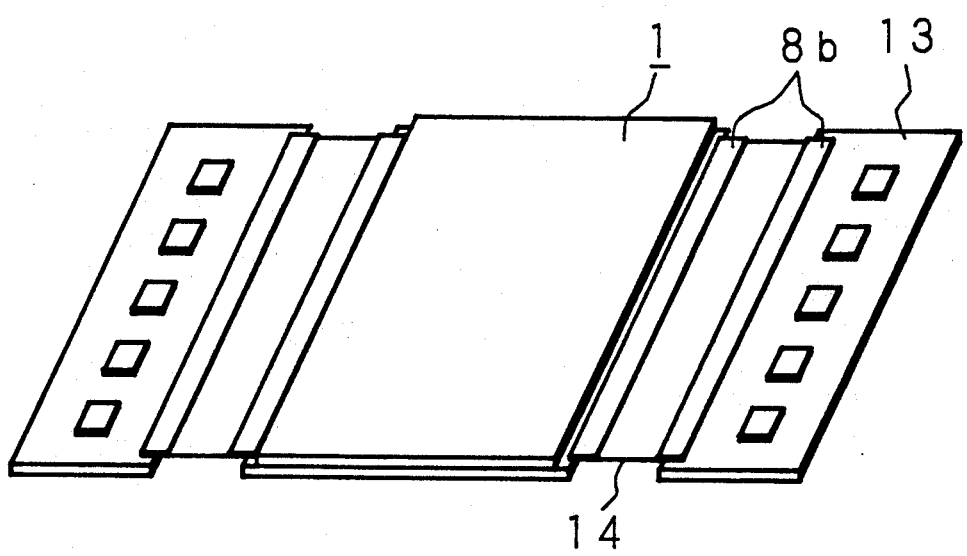
FIG. 8 is a perspective view of a further modified liquid crystal display apparatus employing the electric circuit of this invention.

In FIG. 8, the glass substrate 2 is electrically connected by an FPC using an insulating film 14 to a glass epoxy printed circuit board 13 having plural IC chips thereon. To be exact, the electrode pattern 3 is connected to the conductive pattern on the printed circuit board 13 via a conductive pattern on the insulating film 14. Each connecting part of the insulating film 14 to the glass substrate 2 and to the printed circuit board 13 is bonded by a long ceramic plate 8b.

Although the ceramic plate is used as the insulating material having approximately the equal coefficient of linear expansion as glass in the foregoing embodiments, the other insulating material may be used so long as the coefficient of linear expansion is approximately equal to that of the glass substrate 2.

Moreover, although the above description is related to the electric circuit of the liquid crystal display apparatus, this invention is applicable to an electric circuit composed of plural circuit patterns formed on a plurality of substrates, respectively, of different coefficients of linear expansion.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. An electric circuit composed of plural circuit patterns which are formed on respective substrate and connected with each other, comprising:
    a first circuit pattern formed on a substrate having a first coefficient of linear expansion;
    a second circuit pattern formed on a substrate having a second coefficient of linear expansion and connected with said first circuit pattern; and
    an insulating material having approximately the equal coefficient of linear expansion as the first coefficient of linear expansion and bonded at least to a part were said second circuit pattern is connected to said first circuit pattern.

2. An electric circuit according to claim 1, wherein said first coefficient of linear expansion is smaller than said second coefficient of linear expansion.

3. An electric circuit composed of plural circuit pattern which are formed on independent substrates and connected with each other, comprising:
    an electrode pattern formed on a glass substrate;
    a conductive pattern formed on a substrate of a first insulating material having a coefficient of linear expansion larger than that of glass and connected to said electrode pattern; and
    a second insulating material bonded at least to a part where said conductive pattern is connected to said electrode pattern, and having the coefficient of linear expansion approximately equal to that of glass.

4. A liquid crystal display using the electric circuit according to claim 3.

5. An electric circuit according to claim 3, wherein said first insulating material is polyimide.

6. An electric circuit according to claim 3, wherein said second insulating material is ceramics.

7. An electric circuit according to claim 3, further comprising:
    an element mounted on a substrate having a coefficient of linear expansion different from that of said first insulating material and connected to said conductive pattern; and a third insulating material bonded at least to a part where said element is connected to said conductive pattern, and having a coefficient of linear expansion approximately equal to that of glass.

8. A liquid crystal display using the electric circuit according to claim 7.

9. An electric circuit according to claim 7, wherein said third insulating material is polyimide.

* * * * *